(12) United States Patent
Kawahara et al.

(10) Patent No.: US 10,504,808 B2
(45) Date of Patent: Dec. 10, 2019

(54) SEMICONDUCTOR MODULE HAVING IMPROVED STUD BOLT CONFIGURATIONS

(71) Applicant: Mitsubishi Electric Corporation, Tokyo (JP)

(72) Inventors: Fumihito Kawahara, Tokyo (JP); Koji Yamada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/660,993

(22) Filed: Jul. 27, 2017

(65) Prior Publication Data
US 2018/0197799 A1 Jul. 12, 2018

(30) Foreign Application Priority Data
Jan. 12, 2017 (JP) .................... 2017-003474

(51) Int. Cl.
*H01L 23/10* (2006.01)
*H01L 23/053* (2006.01)

(52) U.S. Cl.
CPC ............ *H01L 23/10* (2013.01); *H01L 23/053* (2013.01)

(58) Field of Classification Search
CPC .................................................. H05K 7/1407
See application file for complete search history.

(56) References Cited

U.S. PATENT DOCUMENTS

| 6,483,185 B1* | 11/2002 | Nagase | ................... | H01L 23/24 257/706 |
| 2010/0320315 A1* | 12/2010 | Kashiwagi | ............. | B64D 45/02 244/1 A |
| 2018/0034169 A1* | 2/2018 | Haraguchi | ............... | H02G 3/16 |

FOREIGN PATENT DOCUMENTS

| JP | 2013-213546 A | 10/2013 |
| JP | 2016-158373 A | 9/2016 |

* cited by examiner

*Primary Examiner* — Marcos D. Pizarro
*Assistant Examiner* — Quinton A Brasfield
(74) *Attorney, Agent, or Firm* — Studebaker & Brackett PC

(57) ABSTRACT

A semiconductor module includes a case. The case includes a bottom part, a case frame, and a case lid. An inner electrode and a stud bolt are provided inside the case. A head part of the stud bolt is tapered, and a tubular part has an inner diameter that increases downward so as to keep a constant distance from the sides of the head part. With this structure, even if the stud bolt is pulled up, the tubular part can hold down the head part. Therefore, the stud bolt can be prevented from being loosened or detached by the force applied from a terminal fixing screw when an external connection terminal is attached or removed.

6 Claims, 7 Drawing Sheets

*Fig. 13*  *Related Art*

COMPARATIVE EXAMPLE

SEMICONDUCTOR MODULE HAVING IMPROVED STUD BOLT CONFIGURATIONS

BACKGROUND OF THE INVENTION

1. Field of the Invention

The present invention relates to a semiconductor module.

2. Description of the Related Art

Conventionally, power semiconductor devices, in which stud bolts are used as a fixing component, are known as disclosed, for example, in Japanese Patent Application Laid-open No. 2016-158373.

The inventors of the present application have been engaged in developing a semiconductor module that uses stud bolts but has a different structure from that of conventional modules such as the one mentioned above. The module structure developed by the inventors of the present application includes a case having a case lid, a case frame, and a bottom part, an inner electrode disposed inside the case, and a plate-like protrusion that protrudes from an inner wall of the case frame and overlaps the inner electrode. The inner electrode and the plate-like protrusion are each provided with a through hole, and a stud bolt is screwed in the through hole of the inner electrode. The stud bolt head is secured to the plate-like protrusion with an adhesive. In this module structure, the head of the stud bolt is exposed from the through hole in the case lid, so that an external connection terminal can be fixed to the stud bolt through this through hole.

It has been found out that such a module structure has the following problem. When attaching or removing an external connection terminal to or from the stud bolt, a torsional force is applied to twist the threaded part of the stud bolt, so that there is a risk that the stud bolt may come loose. When this is the case, there is a worry that the stud bolt may come off.

The module structure described above requires work of applying an adhesive around the head part of the stud bolt. In this work, one factor that slows down the process is that the adhesive runs down and cannot be applied well on the head part of the stud bolt. As a result, the asemblability of the semiconductor module was adversely affected.

SUMMARY OF THE INVENTION

The present invention was made to solve the problem described above and it is an object of the invention to provide a semiconductor module that can prevent stud bolts from coming off when external connection terminals are attached or removed.

It is another object of the present invention to provide a semiconductor module with improved assemblability.

According to a first aspect of the present invention, a semiconductor module includes: a bottom part; an inner electrode; a case frame; a stud bolt; a case lid; and an adhesive. The bottom part is configured to constitute a bottom surface of a ease accommodating a semiconductor device, and the bottom part has an upper face on which the semiconductor device is mounted. The inner electrode includes an electrode plate portion provided above the bottom part, and a connecting portion configured to electrically connect the electrode plate portion and the semiconductor device. The electrode plate portion is provided with a first through hole penetrating the electrode plate portion in a thickness direction thereof. The case frame includes an annular frame part and a plate-like protrusion protruding in the form of a plate from an inner wall of the frame part. The frame part has a lower end portion connected to a peripheral portion of the bottom part. The plate-like protrusion overlaps the electrode plate portion. The plate-like protrusion is provided with a second through hole communicating with the first through hole. The stud bolt includes, at one end thereof, a threaded part having a first series of threads, and includes, at the other end thereof, a head part having a tapered shape with a larger diameter than that of the threaded part. The head part is provided with a threaded hole having a second series of threads in an inner wall thereof. The threaded part is screwed in the first through hole. The case lid includes a flat plate part and a tubular part. The flat plate part is mounted to an upper end portion of the frame part and is provided with a third through hole directly above the head part. The tubular part is protruding downward from a periphery of the third through hole in the flat plate part to surround sides of the head part and has an inner diameter that increases downward. The adhesive is provided in a gap between the head part and the tubular part.

According to a second aspect of the present invention, a semiconductor module includes: a bottom part; an inner electrode; a case frame; a stud bolt; a case lid; and a tubular part. The bottom part is configured to constitute a bottom surface of a case accommodating a semiconductor device, and the bottom part has an upper face on which the semiconductor device is mounted. The inner electrode includes an electrode plate portion provided above the bottom part, and a connecting portion configured to electrically connect the electrode plate portion and the semiconductor device. The electrode plate portion is provided with a first through hole penetrating the electrode plate portion in a thickness direction thereof. The case frame includes an annular frame part and a plate-like protrusion protruding in the form of a plate from an inner wall of the frame part. The frame part has a lower end portion connected to a peripheral portion of the bottom part. The plate-like protrusion overlaps the electrode plate portion. The plate-like protrusion is provided with a second through hole communicating with the first through hole. The stud bolt includes, at one end thereof, a threaded part having a first series of threads, and includes, at the other end thereof, a head part having a larger diameter than that of the threaded part. The head part is provided with a threaded hole having a second series of threads in an inner wall thereof. The threaded part is screwed in the first through hole. The case lid is mounted to an upper end portion f the frame part and is provided with a third through hole directly above the head part. The tubular part is provided to at least one of the case lid and the plate-like protrusion. The tubular part is configured to form, with an inner circumferential surface thereof and a surface of the plate-like protrusion, a container. The container holds an adhesive around the head part. The tabular part is configured to communicate with the third through hole. The adhesive is filled between the tubular part and the head part.

Other and further objects, features and advantages of the invention will appear more fully from the following description.

BRIEF DESCRIPTION OF DRAWINGS

FIG. 13 is a cross-sectional view of a semiconductor module according to a comparative example in comparison to the embodiment of the present invention.

DESCRIPTION OF THE PREFERRED EMBODIMENTS

Embodiment 1

Figure 1:
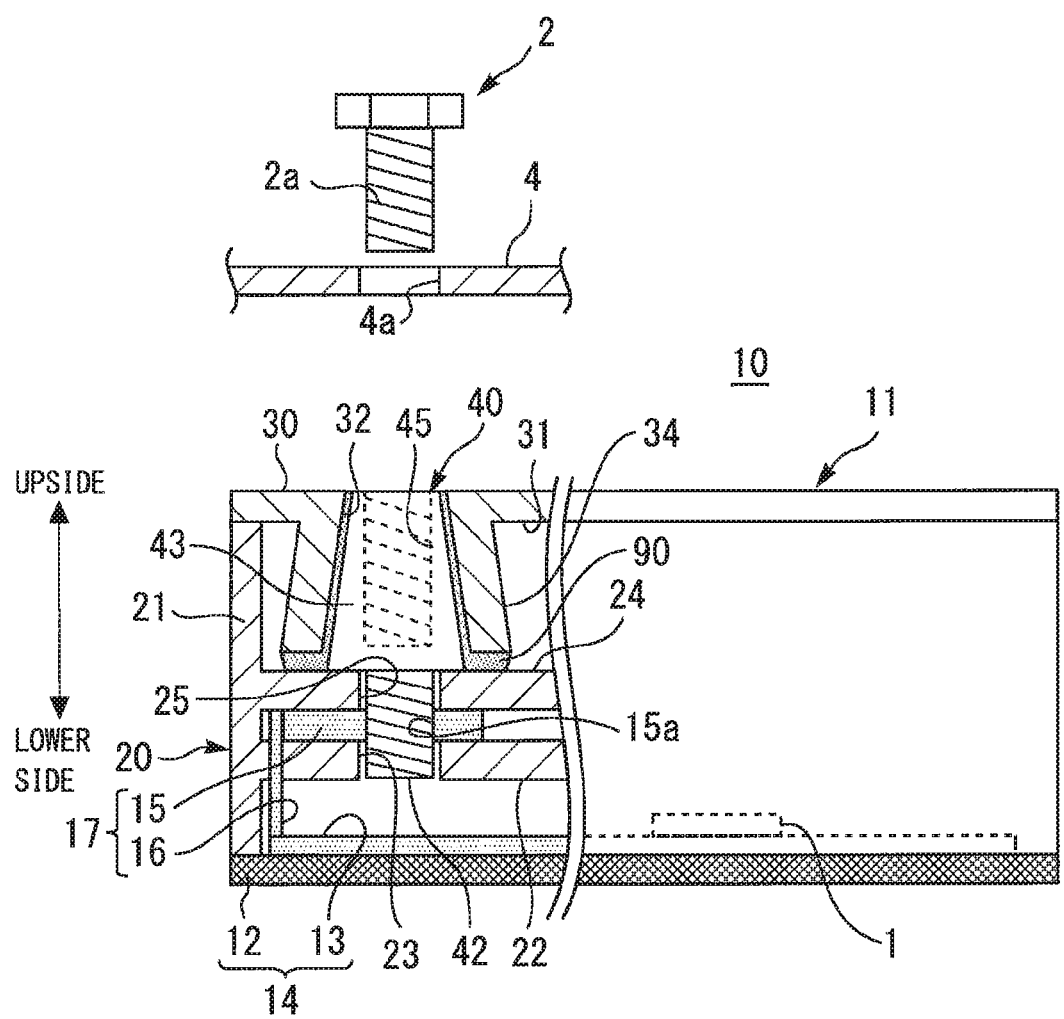
FIG. 1 is a cross-sectional view of a semiconductor module according to Embodiment 1 of the present invention.

FIG. 1 is a cross-sectional view of a semiconductor module 10 according to Embodiment 1 of the present invention. FIG. 1 shows a cut section near a side face of the semiconductor module 10 to illustrate the internal structure. The semiconductor module 10 includes a case 11. The case 11 accommodates a semiconductor device 1 inside. The case 11 includes a bottom part 14, a case frame 20, and a case lid 30. An inner electrode 17 and a stud bolt 40 are provided inside the case 11. Hereinbelow, for convenience of explanation, the up-and-down direction is defined as follows: the case lid 30 side of the case 11 as shown in FIG. 1 shall be the "upper" side, while the bottom part 14 side of the case 11 shall be the "lower" side.

The bottom part 14 constitutes the bottom surface of the case 11. More specifically, for example, the bottom part 14 includes a base plate 12 and a substrate 13 superposed on this base plate 12. A metal pattern (not shown) is formed on the surface of the substrate 13. A semiconductor device 1 is mounted to this metal pattern. The semiconductor device 1 is a power semiconductor device, which is a switching device such as an IGBT or MOSFET. The semiconductor device 1 may be made of Si, or a material known as a wide-bandgap semiconductor such as SiC or GaN. The upper face of the substrate 13 is also the upper face of the bottom part 14.

The inner electrode 17 includes an electrode plate portion 15 and a connecting portion 16. The electrode plate portion 15 is provided above and parallel to the bottom part 14. One end of the connecting portion 16 is connected to one end of the electrode plate portion 15, while the other end of the connecting portion 16 is connected to the metal pattern on the substrate 13. The connecting portion 16 electrically connects the semiconductor device 1 mounted on the upper face of the bottom part 14 with the electrode plate portion 15. The electrode plate portion 15 is provided with a first through hole 15a that penetrates the electrode plate portion 15 in a thickness direction.

The case frame 20 includes a frame part 21, a first plate-like protrusion 24, and a second plate-like protrusion 22. The frame part 21 has an annular shape in a planar view of the bottom part 14, and thus a lower end portion of the frame part 21 is connected to a peripheral edge portion of the bottom part 14. The first plate-like protrusion 24 and second plate-like protrusion 22 protrude in the form of a plate from an inner wall of the frame part 21. The first plate-like protrusion 24 and second plate-like protrusion 22 each have a front side facing upward of the case 11 and a backside facing downward of the case 11.

The first plate-like protrusion 24 is placed on top of the electrode plate portion 15, while the second plate-like protrusion 22 is placed under the electrode plate portion 15. The backside of the first plate-like protrusion 24 is in contact with the electrode plate portion 15. The first plate-like protrusion 24 and the second plate-like protrusion 22 are provided with second through holes 23 and 25, respectively, which communicate with the first through hole 15a. The second plate-like protrusion 22 can be omitted.

Figure 2:
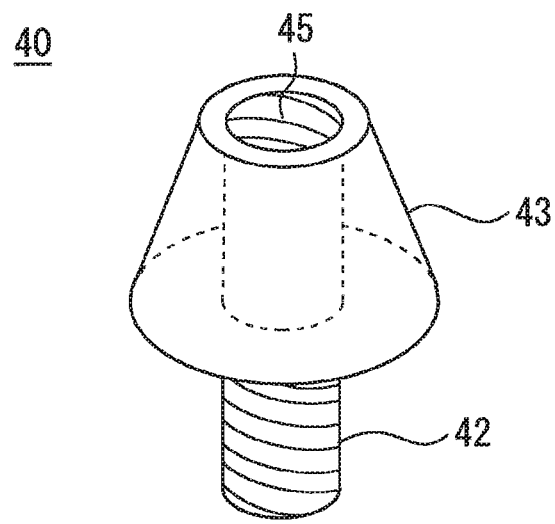
FIG. 2 is a perspective view of the stud bolt according to Embodiment 1 of the present invention.

FIG. 2 is a perspective view of the stud bolt 40 according to Embodiment 1 of the present invention. The stud bolt 40 has a threaded part 42 and a head part 43. The threaded part 42 is provided at one end of the stud bolt 40 and has a first series of threads on its surface. The head part 43 is provided at the other end of the stud bolt 40 and has a tapered shape with a larger diameter than that of the threaded part 42. The head part 43 is provided with a threaded hole 45 that has a second series of threads in the inner wall thereof.

As shown in FIG. 1, the threaded part 42 of the stud bolt 40 is screwed in the first through hole 15a provided in the electrode plate portion 15. Thus the stud bolt 40 is fixed to the case frame 20, with the first plate-like protrusion 24, electrode plate portion 15, and second plate-like protrusion 22 superposed upon one another.

As shown in FIG. 1, the case lid 30 includes a flat plate part 31 and a tubular part 34. The flat plate part 31 is mounted to an upper end portion of the frame part 21. The flat plate part 31 covers the case 11. A third through hole 32 is provided in the flat plate part 31 directly above the stud bolt 40. The tubular part 34 protrudes downward from the periphery of the third through hole 32 of the flat plate part 31. The tubular part 34 surrounds the sides of the head part 43 and has an inner diameter that increases downward. As will be described later, the third through hole 32 is used for fixing an external connection terminal 4 to the threaded hole 45 of the stud bolt 40 with a terminal fixing screw 2.

There is a gap provided between the sides of the head part 43 and the inner circumferential surface of the tubular part 34. Adhesive 90 is applied in this gap, so that the sides of the head part 43 and the inner circumferential surface of the tubular part 34 are bonded together with the adhesive 90. The adhesive 90 also fills the gap between the lower end of the tubular part 34 and a surface of the first plate-like protrusion 24. As a result, the stud bolt 40 is fixed to both of the case frame 20 and the case lid 30 with the adhesive 90.

As shown in FIG. 1, the external connection terminal 4 is fastened to the threaded hole 45 with the terminal fixing screw 2 during use of the semiconductor module 10. With the terminal fixing screw 2 being inserted in a hole 4a of the external connection terminal 4, the threads 2a of the terminal fixing screw 2 are tightened into the threaded hole 45. The external connection terminal 4 is electrically connected to, for example, a control electrode of a semiconductor device 1 mounted on the substrate 13 via the stud bolt 40 and the inner electrode 17. The control electrode would be a gate if the semiconductor device 1 were an IGBT or MOSFET, and a base if the semiconductor device 1 were a bipolar transistor.

In Embodiment 1, the head part 43 of the stud bolt 40 is tapered, i.e., reduces in diameter. In addition, the tubular part 34 increases in inner diameter downward so as to keep the distance between the inner circumferential surface of the tubular part 34 and the sides of the head part 43 constant. With this structure, even if the stud bolt 40 is pulled up, the tubular part 34 can hold down the head part 43. Therefore, the stud bolt 40 can be prevented from being loosened or detached by the force applied from the terminal fixing screw 2 when the external connection terminal 4 is attached or removed. Since the tapered sides of the head part 43 and the tapered inner circumferential surface of the tubular part 34 are bonded together with the adhesive 90, they can be bonded in a larger area as compared to when the head part 43 and tubular part 34 are cylindrical with a constant diameter. Accordingly, the stud bolt 40 and the case lid 30 can be firmly bonded together. Moreover, since the stud bolt 40 is firmly fixed in position by both of the case frame 20 and case lid 30, stress caused by excessive tightening of the external connection terminal 4 can be distributed to the case frame 20 and case lid 30. Thus the possibility of breakage of the case frame 20 that supports the stud bolt 40 is minimized.

Figure 3:
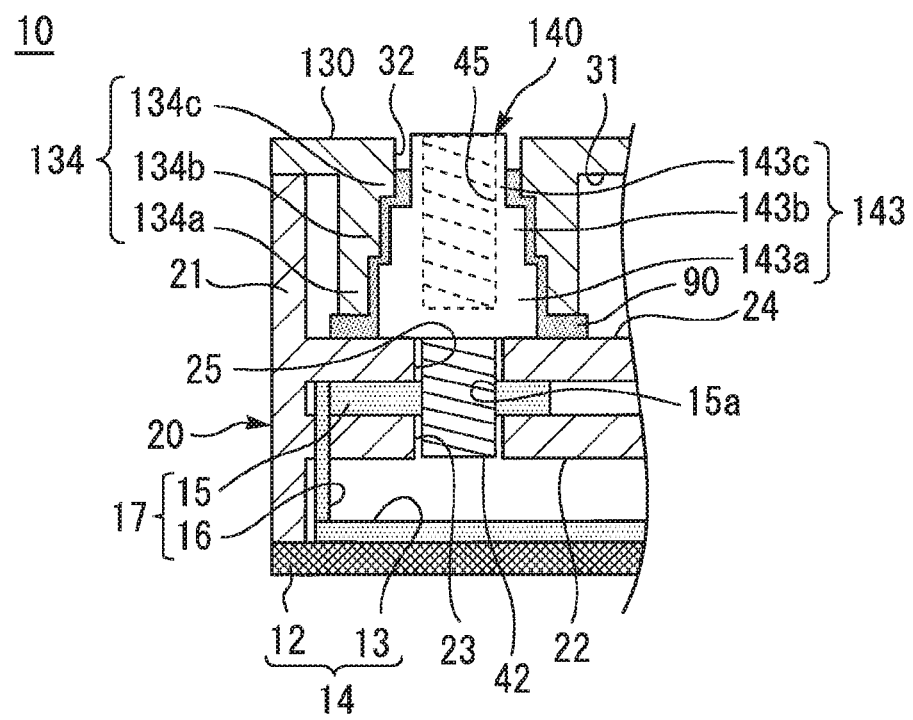
FIG. 3 is a cross-sectional view of the semiconductor module according to a variation example of Embodiment 1 of the present invention.

FIG. 3 is a cross-sectional view of the semiconductor module 10 according to a variation example of Embodiment 1 of the present invention. In the variation example, a stud bolt 140 is used instead of the stud bolt 40. The head part 143 may be tapered stepwise like this stud bolt 140. More specifically, the head part 143 may include a first part 143a, a second part 143b, and a third part 143c that have different diameters. The first part 143a, second part 143b, and third part 143c are arranged in this order from the threaded part 42 side and their diameters decrease in this order.

Moreover, as shown in FIG. 3, the case lid 30 may be replaced with a case lid 130 that has a tubular part 134. The inner diameter of the tubular part 134 is increased stepwise downward so as to keep the distance between an inner circumferential surface of the tubular part 134 and the sides of the head part 143 constant. More specifically, the tubular part 134 may include a first inner circumferential part 134a, a second inner circumferential part 134b, and a third inner circumferential part 134c that have different inner diameters. The third inner circumferential part 134c, second inner circumferential part 134b, and first inner circumferential part 134a are arranged in this order from the base side of the tubular part 134 and their inner diameters increase in this order.

Since the head part 143 of the stud bolt 140 is tapered stepwise, the bonding area is increased. Moreover, the irregularities provided by the steps on the side face of the tubular part 134 increase the bonding area. As the section modulus of the tubular part 134 is increased, the strength of the tubular part 134 is also improved. Thus the possibility of breakage of the case lid 30 can be reduced.

FIG. 13 is a cross-sectional view of a semiconductor module 410 according to a comparative example in comparison to the embodiment of the present invention. The comparative example of FIG. 13 includes a case lid 60 instead of the case lid 30, and a stud bolt 50 instead of the stud bolt 40. The stud bolt 50 has a head part 53 with a constant diameter. The stud bolt 50 has the same structure as that of the stud bolt 40 according to Embodiment 1 apart from this, i.e., it has the threaded hole 45 and threaded part 42. The diameter of the head part 53 is larger than that of the threaded part 42. While the head part 53 is depicted as having a diameter slightly larger than the inner diameter of the second through hole 25 for convenience of illustration in FIG. 13, the head part 53 in actuality may have a diameter sufficiently larger than the inner diameter of the second through hole 25.

The case lid 60 includes a flat plate part 61 and a tubular part 64. The tubular part 64 protrudes downward from the periphery of a third through hole 62 of the case lid 60 and surrounds the sides of the head part 53. There is a gap between the distal end of the tubular part 64 and the surface of the first plate-like protrusion 24. In the comparative example shown in FIG. 13, the stud bolt 50 is secured to the case frame 20 with a screw. The head part 53 of the stud bolt 50 is fixed to the case lid 60 with the adhesive 90. Further, the case lid 60 is fixed to the case frame 20 with an adhesive 70. The lower end portion of the tubular part 64 is separated from the surface of the first plate-like protrusion 24 and there is a large gap between them.

In the comparative example of FIG. 13, the head part 53 and tubular part 64 are both tubular with a constant diameter. As compared to the comparative example of FIG. 13, the semiconductor module 10 according to Embodiment 1 has a tapered head part 43 and tubular part 34, or a stepped head part 143 and tubular part 134. Therefore, as compared to the case of FIG. 13, the bonding area between the head part 43 or 143 of the stud bolt 40 or 140 and the case lid 30 or 130 is increased in Embodiment 1. Therefore, the bonding strength can be improved, and the possibility of the stud bolt 40 or 140 being loosened can be minimized. Also, the force applied when connecting the external connection terminal 4 to the stud bolt 40 or 140 can be distributed to the case 11 side.

Embodiment 2

Figure 4:
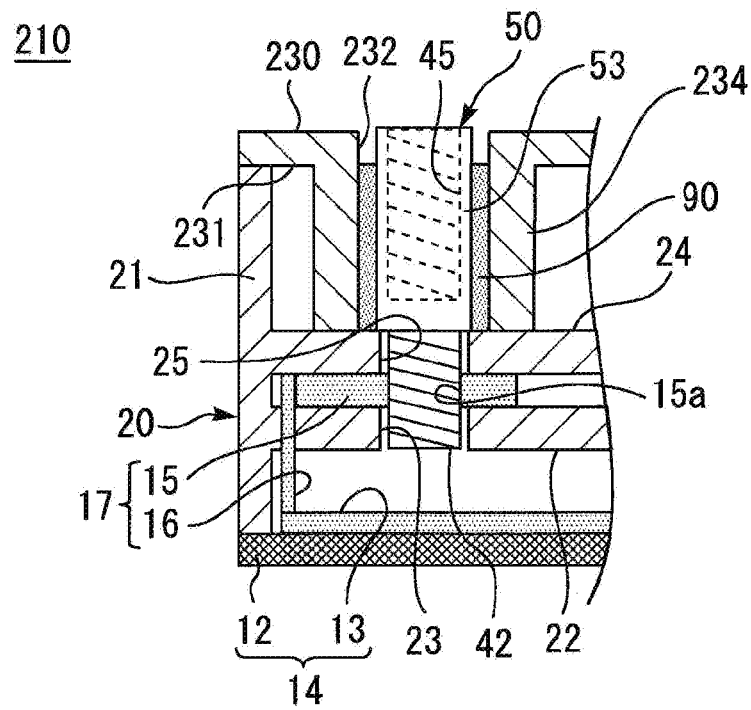
FIG. 4 is a cross-sectional view of a semiconductor module according to Embodiment 2 of the present invention.

FIG. 4 is a cross-sectional view of a semiconductor module 210 according to Embodiment 2 of the present invention. The semiconductor module 210 according to Embodiment 2 has a structure similar to that of the semiconductor module 10 according to Embodiment 1 except that it includes a case lid 230 that has a tubular part 234 instead of the case lid 30 with the tubular part 34 in Embodiment 1, and that the stud bolt 40 is replaced with the stud bolt 50. Therefore, differences between Embodiments 1 and 2 will mainly be explained in the following description, and the same or corresponding structural features are given the same reference numerals and the description thereof will be omitted.

The tubular part 234 protrudes downward from the periphery of a third through hole 232 in a flat plate part 231 of the case lid 230. The tubular part 234 surrounds the sides of the head part 53 as it extends downward, its lower end contacting a surface of the first plate-like protrusion 24.

The tubular part 234 in Embodiment 2 is similar to Embodiment 1 in that it communicates with the third through hole 232, but different from Embodiment 1 in that a "container holding the adhesive 90" is formed around the head part 53. The container holding the adhesive 90 is formed by the inner circumferential surface of the tubular part 234 and the surface of the first plate-like protrusion 24. The gap between the tubular part 234 and the head part 53 is filled with the adhesive 90. Since the lower end of the tubular part 234 is in contact with the surface of the first plate-like protrusion 24, the adhesive 90 does not leak out of the tubular part 234.

According to Embodiment 2, the adhesive 90 can be injected from the head part 53 side after the stud bolt 50 has been assembled to the case frame 20. Since the adhesive 90 is stopped from running down, the operation of injecting the adhesive 90 can be carried out smoothly, so that the assemblability is improved. With the tubular part 234 surrounding the head part 53 of the stud bolt 50. the adhesive 90 can be reliably filled between them, so that the bonding strength can also be increased.

If the adhesive 90 has insulating properties, it may impede electrical conduction if the adhesive 90 enters the first through hole 15a and gets between the stud bolt 50 and the inner electrode 17. Therefore, the adhesive 90 should preferably be introduced after the stud bolt 50 has been tightened.

A comparison between Embodiment 2 and the comparative example shown in FIG. 13 shows first that, in the comparative example of FIG. 13, there is a large gap between the lower end portion of the upper tubular part 64 and the surface of the first plate-like protrusion 24 when injecting the adhesive 90 from the head part 53 side of the stud bolt 50. The adhesive 90 can leak out through this gap so that the filling properties of the adhesive 90 are deteriorated. This results in poor work efficiency and reduces the productivity, In this respect, the assembling can be facilitated with the semiconductor module 210 according to Embodiment 2, since leakage of the adhesive 90 is prevented and the filling and injection properties when applying the adhesive 90 are improved.

Variation examples of the tubular part of Embodiment 2 will be described below. The "tubular part" of Embodiment 2 need only be provided to at least one of the case lid 230 and the first plate-like protrusion 24.

Figure 5:
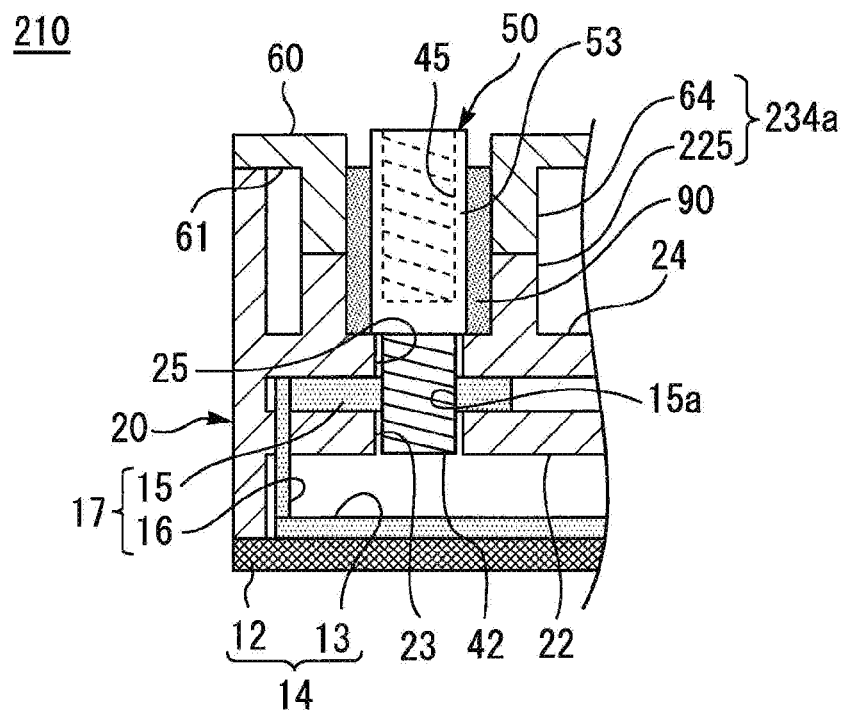
FIG. 5 is a cross-sectional view of the semiconductor module according to a variation example of Embodiment 2.

FIG. 5 is a cross-sectional view of the semiconductor module 210 according to a variation example of Embodiment 2. The tubular part 234 of FIG. 4 can be modified to be like a tubular part 234a shown in FIG. 5. In this variation example, the case lid 230 is replaced with the case lid 60 of the comparative example of FIG. 13. The tubular part 234 is made up of a tubular portion 64 and a lower tubular part 225. Here, the "tubular portion 64" is similar to the one already shown as the comparative example in FIG. 13. In Embodiment 2, however, the tubular portion 64 shall be referred to as "upper tubular part 64", as it is a portion that forms one tubular part 234 together with the lower tubular part 225.

The lower tubular part 225 extends upward from the surface of the first plate-like protrusion 24 and surrounds the sides of the head part 53. In the variation example of FIG. 5, the distal end of the lower tubular part 225 abuts on the distal end of the upper tubular part 64. In the variation example of FIG. 5, the adhesive 90 can be applied to the gap between the head part 53 screwed inside the lower tubular part 225 and the inner circumferential surface of the lower tubular part 225 before the case lid 60 is placed. The adhesive 90 may additionally be applied to the gap between the upper tubular part 64 and the head part 53 after the case lid 60 has been placed.

Figure 6:
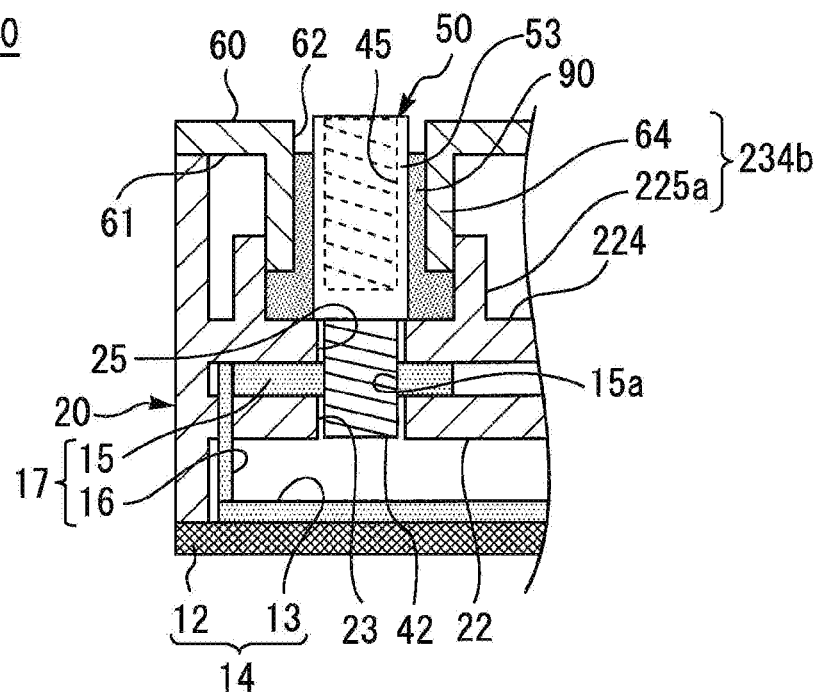
FIG. 6 is a cross-sectional view of the semiconductor module according to a variation example of Embodiment 2.

FIG. 6 is a cross-sectional view of the semiconductor module 210 according to a variation example of Embodiment 2. The tubular part 234a of FIG. 5 can be modified to be like a tubular part 234b shown in FIG. 6. The tubular part 234b includes the upper tubular part 64 provided to the case lid 60, and a lower tubular part 225a that extends upward from the surface of the first plate-like protrusion 24 and surrounds the outer circumference of the upper tubular part 64. In the variation example of FIG. 6, the outer circumference of the lower end of the upper tubular part 64 is in contact with the inner circumference of the upper end of the lower tubular part 225a. As the lower tubular part 225a and the upper tubular part 64 overlap this way, the adhesive 90 can be stopped from leaking out of the tubular part 234b, so that the filling properties of the adhesive 90 can be improved. Similarly to the variation example of FIG. 5, the adhesive 90 can be applied to the gap between the head part 53 screwed inside the lower tubular part 225a and the lower tubular part 225a before the case lid 60 is placed.

Figure 7:
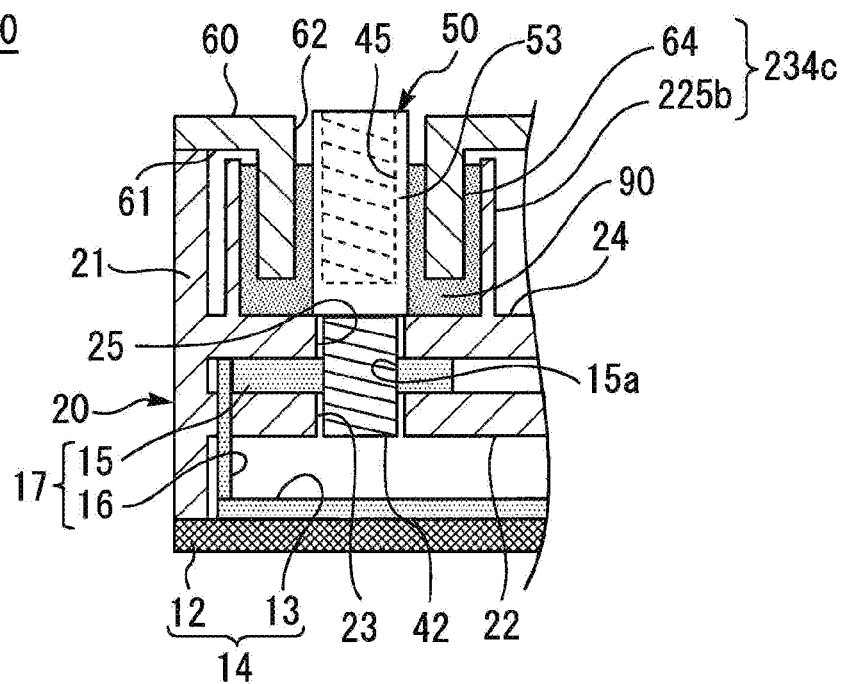
FIG. 7 is a cross-sectional view of the semiconductor module according to a variation example of Embodiment 2.

FIG. 7 is a cross-sectional view of the semiconductor module 210 according to a variation example of Embodiment 2. The tubular part 234b of FIG. 6 can be modified to be like a tubular part 234c shown in FIG. 7. The tubular part 234c is modified such that the lower tubular part 225a of FIG. 6 is replaced with a lower tubular part 225b. The lower tubular part 225b is made longer than the lower tubular part 225a, i.e., the distal end of the lower tubular part 225b extends up to the base of the upper tubular part 64. The lower tubular part 225b has an inner diameter that is larger than the outer shape of the upper tubular part 64, and there is a gap filled with the adhesive 90 between the lower tubular part 225b and the upper tubular part 64. The variation example of FIG. 7 is a structure wherein two tubes are formed around the head part 53.

Figure 8:
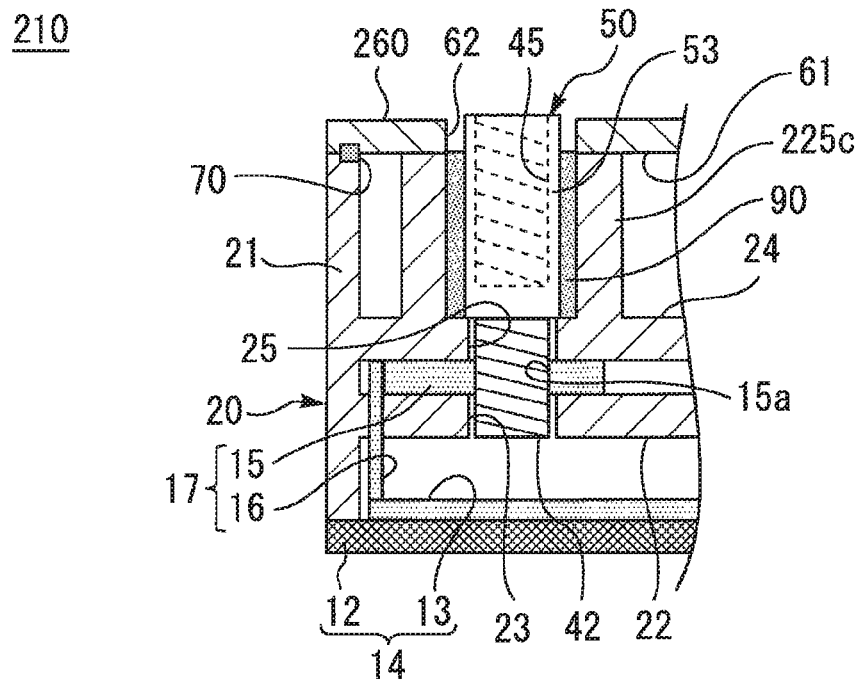
FIG. 8 is a cross-sectional view of the semiconductor module according to a variation example of Embodiment 2.

FIG. 8 is a cross-sectional view of the semiconductor module 210 according to a variation example of Embodiment 2. A tubular part 225c shown in FIG. 8 can be provided instead of the tubular part 234 of FIG. 4. The tubular part 225c extends upward from the surface of the first plate-like protrusion 24, and surrounds the sides of the head part 53. The distal end of the tubular part 225c is in contact with the case lid 260. The case lid 260 has the third through hole 62. However, unlike the case lid 30 or 60, the ease lid 260 does not have a tubular part that extends down below the third through hole 62 and is flat around the third through hole 62. In such a structure, too, the adhesive 90 can be applied to. the gap between the head part 53 screwed inside the lower tubular part 225c and the inner circumferential surface of the tubular part 225c before the case lid 260 is placed. Since the case lid 260 is not in contact with the adhesive 90, it is not fixed in position with the adhesive 90. The frame part 21 of the case frame 20 and the case lid 260 may be bonded together with the adhesive 70. In addition to or instead of the adhesive 70, a screw component (not shown) may further be provided to secure the case lid to the case frame 20, or an engagement portion may be provided between the case frame 20 and the case lid 260 to fixedly join them by the mating engagement.

Figure 9:
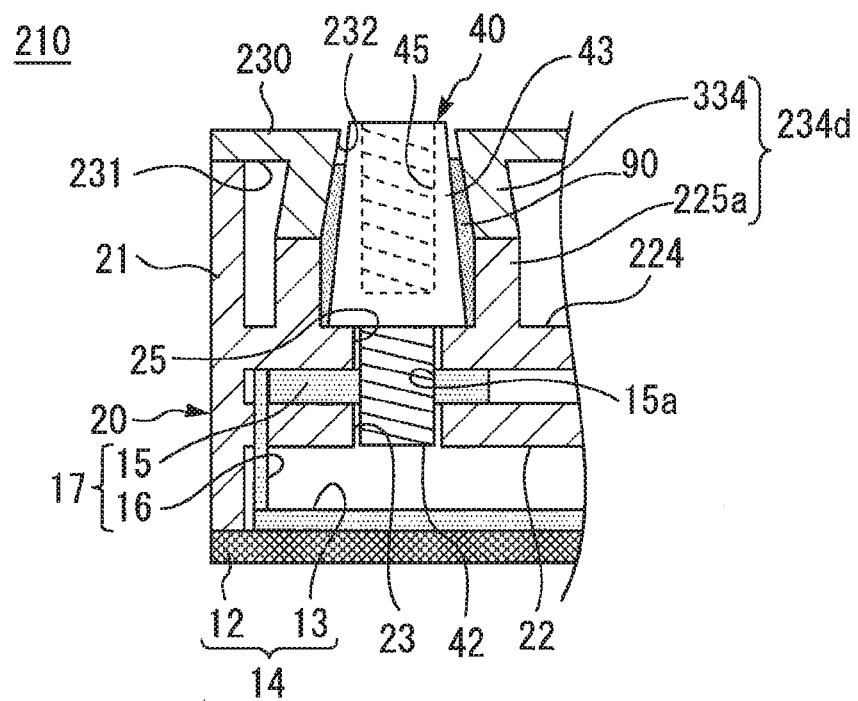
FIG. 9 is a cross-sectional view of the semiconductor module according to a variation example of Embodiment 2.

A semiconductor module 210 having the characteristic structures of both of Embodiments 1 and 2 may be provided. FIG. 9 is a cross-sectional view of the semiconductor module 210 according to a variation example of Embodiment 2. In the variation example of FIG. 9, a tubular part 234d is formed by an upper tubular part 334 and the lower tubular part 225a. Similarly to the variation example shown in FIG. 5, an upper end portion of the lower tubular part 225a abuts on a lower end portion of the upper tubular part 334 in FIG. 9. Instead of the stud bolt 50, the stud bolt 40 according to Embodiment 1 is used. The head part 43 of the stud bolt 40 has a tapered shape, reducing in diameter toward the other end. The upper tubular part 334 increases in inner diameter downward so as to keep the distance between the inner circumferential surface of the upper tubular part 334 and the sides of the head part 43 constant. As has been shown in the variation example of Embodiment 1 (see FIG. 3), the stud bolt 140 that has the head part 143 with a stepwise taper can be combined with Embodiment 2.

In that case, the inner circumferential surface of the upper tubular part 334 in the variation example of FIG. 9 may be stepped for example as in the tubular part 134 shown in FIG. 3.

Figure 10:
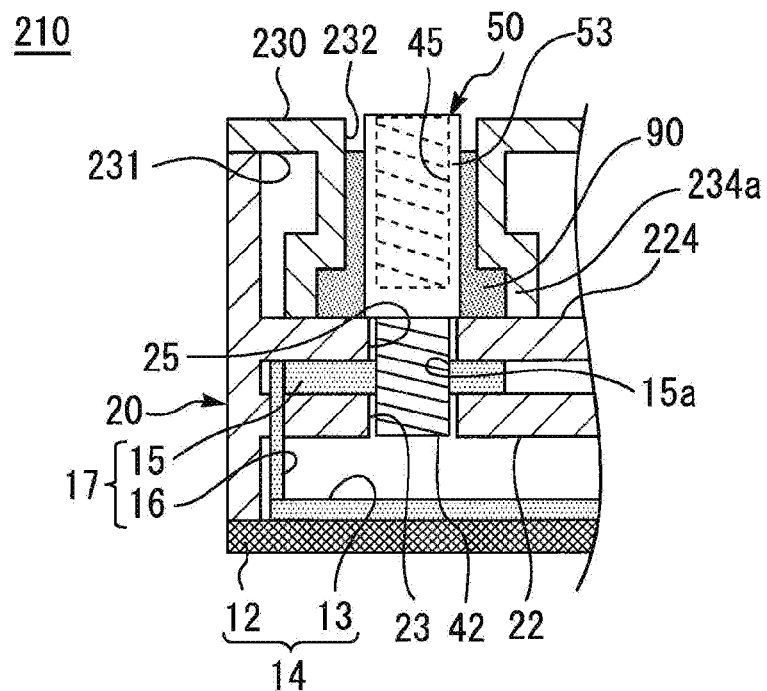
FIG. 10 is a cross-sectional view of the semiconductor module according to a variation example of Embodiment 2.

FIG. 10 is a cross-sectional view of the semiconductor module 210 according to a variation example of Embodiment 2. The tubular part 234a shown in FIG. 10 is increased in diameter stepwise in a lower portion of the tubular part 234 shown in FIG. 4. The upper portion of the tubular part 234a is tubular and has a "first inner diameter", and the lower portion of the tubular part 234a is tubular and has a "second inner diameter" that is different from the first inner diameter, wherein the first inner diameter is smaller than the second inner diameter. The tubular part 234a has a cross-sectional shape similar to that of the tubular part 234b of FIG. 6. The tubular part 234a can thus have a cross section with a stepped contour. With the tubular part 234a having a stepped cross section, the bonding area is increased. Moreover, since the section modulus of the tubular part 234a is increased, the strength of the tubular part 234a is improved.

As a further variation example of FIG. 10, the portions with the large and small inner diameters of the tubular part 234a may be inverted. Namely, the first inner diameter may be larger than the second inner diameter.

Figure 11:
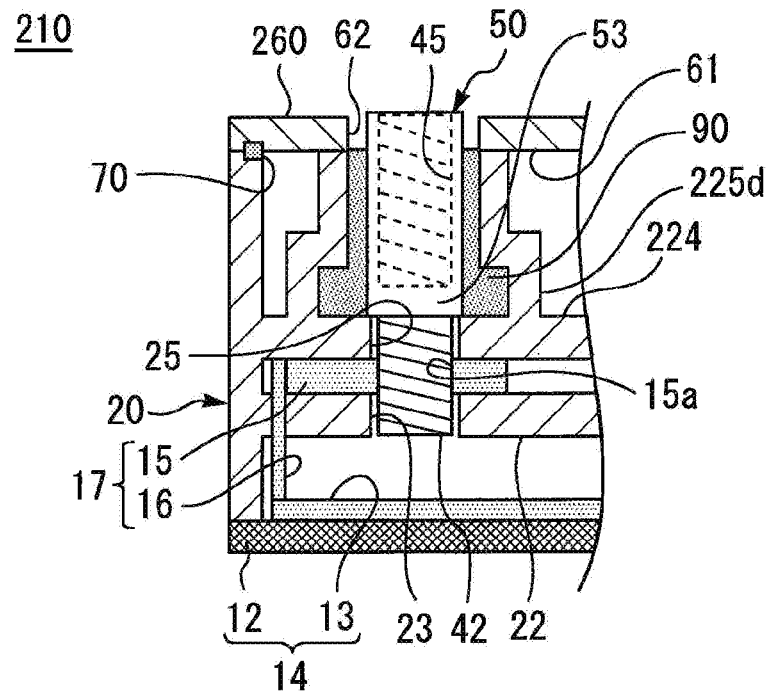
FIG. 11 is a cross-sectional view of the semiconductor module according to a variation example of Embodiment 2.

FIG. 11 is a cross-sectional view of the semiconductor module 210 according to a variation example of Embodiment 2. The tubular part 225d shown in FIG. 11 is a modification of the tubular part 225c shown in FIG. 8. The tubular part 225d shown in FIG. 11 is decreased in diameter stepwise in an upper portion of the tubular part 225c shown in FIG. 8. The lower portion of the tubular part 225d is tubular and has a "third inner diameter", and the upper portion of the tubular part 225d is tubular and has a "fourth inner diameter" that is different from the third inner diameter, wherein the third inner diameter is larger than the fourth inner diameter. The tubular part 225d has a cross-sectional shape similar to that of the tubular part 234b of FIG. 6. The tubular part 225d can thus have a cross section with a stepped contour. With the tubular part 225d having a stepped cross section, the bonding area is increased. Moreover, since the section modulus of the tubular part 225d is increased, the strength of the tubular part 225d is improved.

As a further variation example of FIG. 11, the portions with the large and small inner diameters of the tubular part 225d may be inverted. Namely, the third inner diameter may be smaller than the fourth inner diameter.

The tubular parts 225c, 225d, 234, and 234a to 234d in Embodiment 2 may be configured otherwise as long as they form a "container holding the adhesive 90" around the head part 53 of the stud bolt 50. This "container holding the adhesive 90" preferably has complete sealing properties so that the adhesive 90 is reliably kept in the tubular parts 225c, 225d, 234, and 234a to 234d. However, this "container holding the adhesive 90" may also be one that has substantial sealing properties so that not much adhesive 90 leaks out of the tubular parts 225c, 225d, 234, and 234a to 234d, i.e., one that can secure the ability to obstruct the flow of adhesive 90. This is because this "container holding the adhesive 90" is provided for stopping the adhesive 90 from running down. As a further variation example of Embodiment 2, for example, an "air escape through hole" can be provided to the tubular parts 225c, 225d, 234, and 234a to 234d for securing an air release path during injection of the adhesive 90. The air escape through hole may be formed as a small-diameter through hole that penetrates the tubular parts 225c, 225d, 234, and 234a to 234d in the thickness direction thereof.

Embodiment 3

Figure 12:
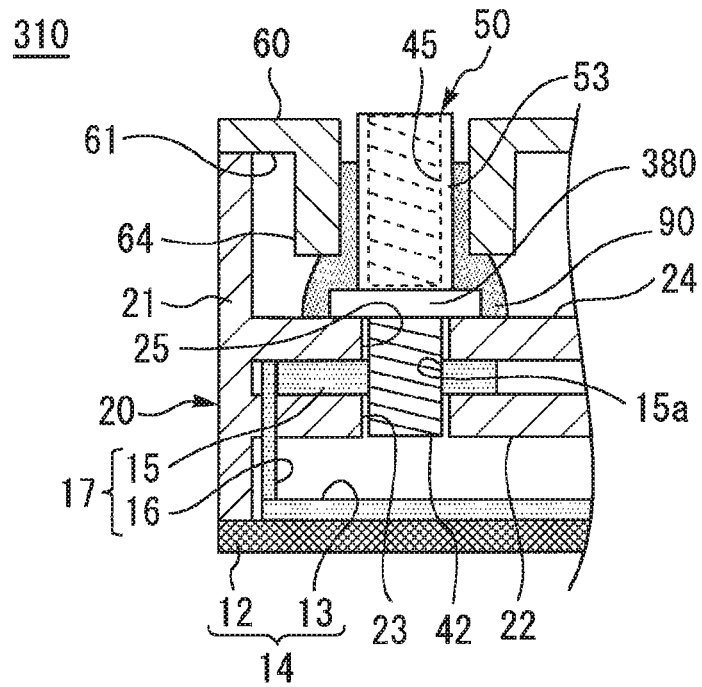
FIG. 12 is a cross-sectional view of a semiconductor module according to Embodiment 3 of the present invention.
Figure 12:
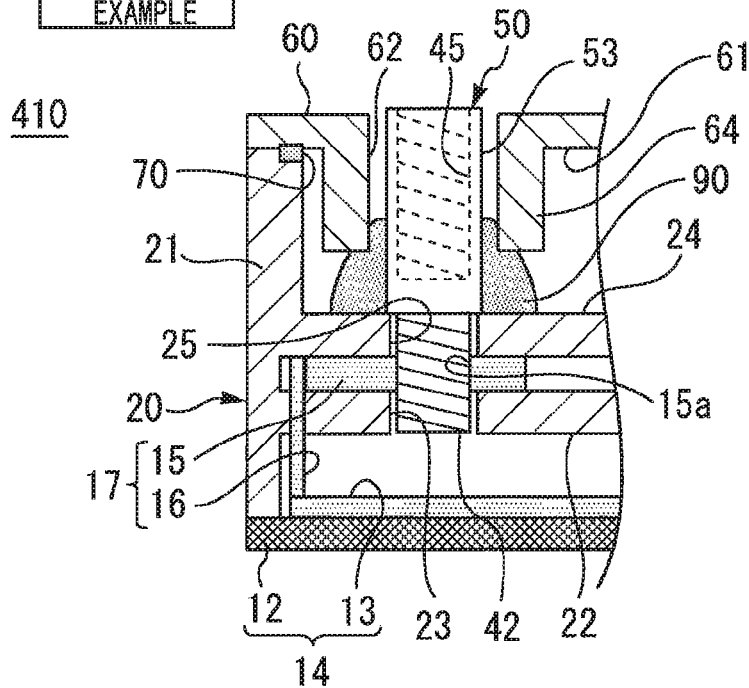

FIG. 12 is a cross-sectional view of a semiconductor module 310 according to a variation example of the embodiment of the present invention. The module may further include a washer 380 fitted to the threaded part 42 and sandwiched between the head part 53 and the first plate-like protrusion 24. The stud bolt 40 is fixed to both of the case frame 20 and the case lid 60 with the adhesive 90. When the washer 380 is mounted, there is created a step, as the washer 380 extends outward of the head part 53. This step increases the contact area between the periphery of the stud bolt 40 and the adhesive 90. As a result, the stud bolt 40 is secured more firmly. Moreover, the washer 380 can help set the center axis of the stud bolt 40 closer to vertical.

Although not shown, the washer 380 may be added to the semiconductor modules 10 shown in FIG. 1 and FIG. 3 according to Embodiment 1. Also, although not shown, the washer 380 may be added to the semiconductor modules 210 shown in FIG. 4 through FIG. 11 according to Embodiment 2.

The features and advantages of the present invention may be summarized as follows.

According to the first aspect of the invention, even if the stud bolt is pulled up, the tubular part holds down the head part of the stud bolt. Therefore, the stud bolt can be prevented from coming off when an external connection terminal is attached or removed.

According to the second aspect of the invention, after the stud bolt has been assembled, the adhesive can be injected from the head part side while it is stopped from running down. As the work of injecting the adhesive can be carried out smoothly, the assemblability can be improved.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2017-003474, filed on Jan. 12, 2017 including specification, claims, drawings and summary, on which the Convention priority of the present application is based, is incorporated herein by reference in its entirety.

What is claimed is:

1. A semiconductor module, comprising:
a bottom part configured to constitute a bottom surface of a case accommodating a semiconductor device, the bottom part having an upper face on which the semiconductor device is mounted;
an inner electrode including an electrode plate portion provided above the bottom part, and a connecting portion configured to electrically connect the electrode plate portion and the semiconductor device, the electrode plate portion being provided with a first through hole penetrating the electrode plate portion in a thickness direction thereof;
a case frame including an annular frame part and a plate-like protrusion protruding in the form of a plate from an inner wall of the frame part, the frame part having a lower end portion connected to a peripheral portion of the bottom part, the plate-like protrusion overlapping the electrode plate portion, the plate-like protrusion being provided with a second through hole communicating with the first through hole;
a stud bolt including, at one end thereof, a threaded part having a first series of threads, and including, at the other end thereof, a head part having a tapered shape with a larger diameter than that of the threaded part, the head part being provided with a threaded hole having a second series of threads in an inner wall thereof, the threaded part being screwed in the first through hole; and a case lid including a flat plate part mounted to an upper end portion of the frame part and provided with a third through hole directly above the head part, and a tubular part protruding downward from a periphery of the third through hole in the flat plate part to surround sides of the head part and having an inner diameter that increases downward, an adhesive being provided in a gap between the head part and the tubular part.

2. The semiconductor module according to claim 1, wherein the head part is tapered.

3. The semiconductor module according to claim 2, wherein the tubular part has an inner diameter that increases gradually downward so as to keep a constant distance from the sides of the head part.

4. The semiconductor module according to claim 1, wherein the head part has a diameter that decreases stepwise.

5. The semiconductor module according to claim 4, wherein the tubular part has an inner diameter that increases stepwise downward so as to keep a constant distance between an inner circumferential surface of the tubular part and the sides of the head part.

6. The semiconductor module according to claim 1, further comprising a washer fitted to the threaded part and sandwiched between the head part and the plate-like protrusion.

* * * * *